(12) United States Patent
LiCausi

(10) Patent No.: US 10,677,855 B2
(45) Date of Patent: Jun. 9, 2020

(54) STRUCTURE, METHOD AND SYSTEM FOR MEASURING RIE LAG DEPTH

(71) Applicant: GLOBALFOUNDRIES INC., Grand Cayman (KY)

(72) Inventor: Nicholas V. LiCausi, Watervliet, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 313 days.

(21) Appl. No.: 15/699,094

(22) Filed: Sep. 8, 2017

(65) Prior Publication Data

US 2019/0079128 A1   Mar. 14, 2019

(51) Int. Cl.

| | |
|---|---|
| G01R 31/50 | (2020.01) |
| H01L 23/528 | (2006.01) |
| H01L 21/66 | (2006.01) |
| H01L 21/311 | (2006.01) |
| H01L 21/768 | (2006.01) |
| G01R 31/26 | (2020.01) |
| H01L 23/544 | (2006.01) |
| G01R 31/28 | (2006.01) |
| H01L 21/3065 | (2006.01) |
| H01L 21/3213 | (2006.01) |

(Continued)

(52) U.S. Cl.
CPC ......... *G01R 31/50* (2020.01); *G01R 31/2601* (2013.01); *G01R 31/2856* (2013.01); *H01L 21/3065* (2013.01); *H01L 21/31116* (2013.01); *H01L 21/31138* (2013.01); *H01L 21/32136* (2013.01); *H01L 21/76816* (2013.01); *H01L 21/76877* (2013.01); *H01L 22/12* (2013.01); *H01L 22/32* (2013.01); *H01L 22/34* (2013.01); *H01L 23/5286* (2013.01); *H01L 23/544* (2013.01); *H01L 22/14* (2013.01); *H01L 23/5226* (2013.01); *H01L 23/5329* (2013.01); *H01L 23/53209* (2013.01); *H01L 23/53214* (2013.01); *H01L 23/53228* (2013.01); *H01L 23/53242* (2013.01); *H01L 23/53257* (2013.01)

(58) Field of Classification Search
CPC .................... H01L 21/32136; H01L 21/76816
See application file for complete search history.

(56) References Cited

U.S. PATENT DOCUMENTS

| | | | |
|---|---|---|---|
| 6,284,666 B1 | 9/2001 | Naeem et al. | |
| 2005/0151224 A1* | 7/2005 | Abe | H01L 21/2885 |
| | | | 257/510 |
| 2015/0255330 A1* | 9/2015 | Lee | H01L 21/76843 |
| | | | 438/653 |

* cited by examiner

*Primary Examiner* — Farun Lu
(74) *Attorney, Agent, or Firm* — Anthony Canale; Hoffman Warnick LLC

(57) ABSTRACT

Structures for measuring RIE lag depth of a semiconductor device, including: a first metal layer; a dielectric cap layer on top of the first metal layer; an electrical ground element formed beneath one or more portions of the dielectric cap layer and within the first metal layer, the electrical ground element being electrically grounded; and a second metal layer on top of the dielectric cap layer, the second metal layer having an array of one or more sub-arrays of metal wires, each sub-array being connected to a respective bond pad and having metal wires of a given width; wherein a distance from a bottom surface of the array of metal wires to a top surface of the dielectric cap layer is indicative of RIE lag depth. The disclosure also relates to methods and systems for measuring RIE lag depth and identifying the existence of an electrical short of a semiconductor device.

9 Claims, 7 Drawing Sheets

(51) Int. Cl.
*H01L 23/532* (2006.01)
*H01L 23/522* (2006.01)

STRUCTURE, METHOD AND SYSTEM FOR MEASURING RIE LAG DEPTH

TECHNICAL FIELD

The subject matter disclosed herein relates to reactive ion etching (RIE) lag depth for semiconductor devices. More specifically, various aspects described herein relate to structures, methods and systems for measuring RIE lag depth and identifying the existence of electrical shorts of semiconductor devices.

BACKGROUND

The fabrication of deep trenches in semiconductor dielectrics is one method of making metallic wires, referred to as interconnects. A deep trench of somewhat trapezoidal shape is etched out of a dielectric layer by a commonly used dry etch method known as reactive ion etching (RIE). There is today an ever increasing need to make the deep trenches more narrow to conserve space on the substrate and, hence, to increase productivity. This reduction process is commonly referred to as scaling. The direct result of scaling is that the width of the deep trench ends up substantially reduced. In order to maximize the cross-sectional area of the interconnect, and thus reduce its wire resistance, its depth must be maintained or increased. Such a situation leads to a high aspect ratio, which is the ratio of the depth of the etched structure relative to its width.

With the requirement of scaling, the control of deep trench side wall passivation has become a fundamental issue and an impediment in achieving deeper trenches. During deep trench etching, the etching process may include simultaneous etching and deposition of a sidewall passivation film. The conventional RIE process is designed in such a manner that the controlled growth of the passivation film prevents isotropic etching to help control the deep trench profile. However, the presence of a thick passivation film on the entire inner surface of the deep trench during the etch process leads to a significantly slower etch rate. The slower etch rate is also due to a high aspect ratio of the deep trenches as noted above. This aspect ratio dependent slowdown of the etch rate is called RIE lag. A result of RIE lag is that smaller width trenches etch less deep than wider width trenches during a given etching timeframe. Thus, when the trenches are filled with metal to form an interconnect, metal with smaller widths are shallower and metal with larger widths are deeper.

Due to misprocessing, poor process setup, etc., RIE lag can cause wide width metal to short to underlying metal even though smaller width metal have depths that are on target and are not shorted. Expensive analysis techniques, such as scanning transmission electron microscopy (STEM), transmission electron microscopy (TEM) and/or scanning electron microscopy (SEM), are typically required to determine the amount of RIE lag and potentially the cause of a failure (e.g., short).

BRIEF SUMMARY

Structures, methods and systems for measuring RIE lag depth and identifying the existence of an electrical short of semiconductor devices are disclosed. In a first aspect of the disclosure, a structure for measuring RIE lag depth of a semiconductor device includes: a first metal layer; a dielectric cap layer on top of the first metal layer; an electrical ground element formed beneath one or more portions of the dielectric cap layer and within the first metal layer, the electrical ground element being electrically grounded; and a second metal layer on top of the dielectric cap layer, the second metal layer having an array of one or more sub-arrays of metal wires, each sub-array being connected to a respective bond pad and having metal wires of a given width; wherein a distance from a bottom surface of the array of metal wires to a top surface of the dielectric cap layer is indicative of RIE lag depth.

A second aspect of the disclosure includes a method of measuring RIE lag depth and identifying the existence of an electrical short of a semiconductor device, including: measuring a capacitance (C) between a) an electrical ground element positioned beneath one or more portions of a dielectric cap layer (CAP) and within a first metal layer under the dielectric cap layer and b) an array of metal wires in a second metal layer (2ML) above the dielectric cap layer, the array having a dimension ($L_1 \times L_2$); measuring a width (W) and a pitch (P) of the metal wires in the array of metal wires; measuring a thickness ($d_{CAP}$) of the dielectric cap layer; calculating an area (A) of the metal wires in the array of metal wires; calculating a distance ($d_{2ML}$) from a bottom surface of the array of metal wires to a top surface of the dielectric cap layer, distance $d_{2ML}$ being the RIE lag depth for a given array of metal wires having width (W); and identifying whether an electrical short exists for the array of metal wires with width (W) and RIE lag depth ($d_{2ML}$) based on an ability to pass a current between the electrical ground element and the array of metal wires.

A third aspect of the disclosure includes a system for measuring RIE lag depth and identifying the existence of an electrical short of a semiconductor device, including: a test structure for measuring RIE lag depth, the test structure comprising a first metal layer, a dielectric cap layer on top of the first metal layer, an electrical ground element formed beneath one or more portions of the dielectric cap layer and within the first metal layer, the electrical ground element being electrically grounded, and a second metal layer above the dielectric cap layer, the second metal layer having an array of one or more sub-arrays of metal wires, each sub-array being connected to a respective bond pad and having metal wires of a given width; and a controller for identifying whether an electrical short exists, the controller being in communication with the test structure and assigning a pass status for lack of an electrical short to any array of metal wires which is not able to pass a current to the electrical ground element, and assigning a fail status for an existence of an electrical short to any array of metal wires which is able to pass a current to the electrical ground element.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
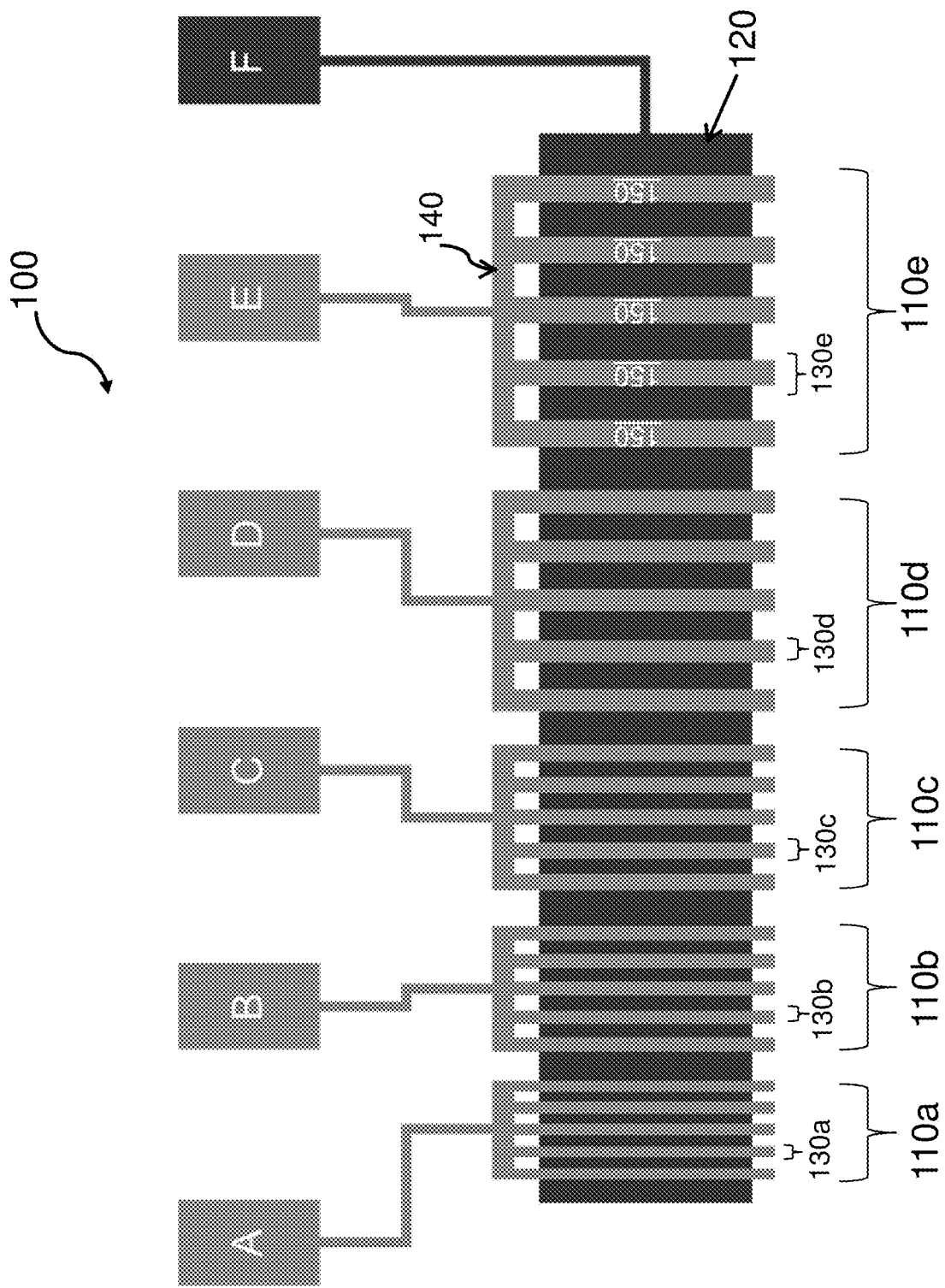
FIG. 1 shows a top down view of a structure of an embodiment of the disclosure having sub-arrays of metal wires over an electrical ground element in the form of a plate.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The subject matter disclosed herein relates to reactive ion etching (RIE) lag depth of semiconductor devices. More specifically, various aspects described herein relate to structures, methods and systems for measuring RIE lag depth and identifying electrical shorts of semiconductor devices.

As noted above, RIE lag can cause wide width wires to short to underlying metal even though smaller width wires have depths on target that do not short. Typically, expensive and/or destructive analysis techniques are required to determine the cause of a short (a type of failure).

The structures, methods and systems of the disclosure provide for measuring RIE lag depth and identifying the existence of an electrical short caused by unacceptable RIE lag in a less expensive and non-destructive manner. More specifically, the structures, methods and systems of the disclosure utilize less expensive electrical measuring techniques that do not destroy (e.g., require cutting) the semiconductor wafer. The structures of the disclosure also have the added benefit of requiring only a small space on the semiconductor wafer.

Various aspects of the disclosure include a structure for measuring RIE lag depth of a semiconductor device, the structure including, among other elements (see e.g., claim 1), an array of one or more sub-arrays of metal wires, each sub-array being connected to a respective bond pad and having metal wires of a given width.

The above-mentioned array can comprise a single sub-array of metal wires, the metal wires of the single sub-array having a particular width. The array can also comprise a plurality of sub-arrays of metal wires, each sub-array including metal wires of a particular width. In other words, an array having two or more sub-arrays has a first sub-array having metal wires of a first width and at least one subsequent sub-array having metal wires of a second, different width from the first width.

FIG. 1 depicts a top down view of a structure 100 of an embodiment of the disclosure having five sub-arrays of metal wires 110a, 110b, 110c, 110d, 110e over an electrical ground element 120. A single electrical ground element 120 is shown as being under all five sub-arrays 110a, 110b, 110c, 110d, 110e. Electrical ground element 120 can, alternatively, be unique to each sub-array 110; in other words, a given electrical ground element 120 can be under a given sub-array 110. Whether electrical ground element 120 is under all sub-arrays 110 or only under a given sub-array 110, electrical ground element 120 is electrically isolated from the sub-arrays by, for example, a dielectric layer. As will be described in greater detail, electrical ground element 120 can have a number of forms, for example plate, comb or serpentine. In FIG. 1, electrical ground element 120 is in the form of a plate.

Sub-arrays 110a, 110b, 110c, 110d, 110e may be comb shaped. The comb shape has a backbone 140 and a number of fingers 150 extending from backbone 140. Fingers 150 are shown perpendicular (at a 90° angle) to backbone 140; however, this may not be necessary in all instances. Fingers 150 may be at an angle greater than or less than 90° to backbone 140, as long as the parallel nature of fingers 150 is substantially maintained. Sub-arrays 110a, 110b, 110c, 110d, 110e are shown with five fingers 150. Fingers 150 can be present at a certain number in one sub-array, and can be present at the same or different number in another sub-array. Sub-arrays 110a, 110b, 110c, 110d, 110e can have any number of fingers, for example, two, three, four, five, ten, twenty, etc. Also, it may not be necessary in all instances for the fingers to be the same length, varying lengths of the fingers within a sub-array or amongst multiple sub-arrays is envisioned.

As seen in FIG. 1, sub-arrays 110a, 110b, 110c, 110d, 110e are each connected to a given bond pad (in this case, bond pads A, B, C, D, E, respectively), and electrical ground element 120 is connected to bond pad F. Bond pads A, B, C, D, E, F are knolls of metal for making interconnections between elements of semiconductor devices. The metal of bond pads A, B, C, D, E, F can be copper (Cu), aluminum (Al), gold (Au), cobalt (Co), ruthenium (Ru), tungsten (W) or silver (Ag). Bond pads A, B, C, D, E, F are shown as being rectangular in shape; however, any shape can be used, for example, square, round, oval, polygonal, etc.

As can also be seen in FIG. 1, wire widths 130a, 130b, 130c, 130d, 130e differ for each respective array 110a, 110b, 110c, 110d, 110e. The width of the metal wires of embodiments of the disclosure is preferably 24 nanometers or less. Example widths include 24 nanometers, 22 nanometers, 20 nanometers, 18 nanometers, 16 nanometers, 14 nanometers, etc. The metal wires of embodiments of the disclosure include a metal selected from copper (Cu), ruthenium (Ru), cobalt (Co), tungsten (W), titanium (Ti), aluminum (Al) and molybdenum (Mo). Electrical ground element 120, regardless of form (e.g., plate, comb or serpentine), can have the same compositional make-up as that of the metal wires. Specifically, the electrical ground element may include a metal selected from Cu, Ru, Co, W, Ti, Al and Mo.

Figure 2:
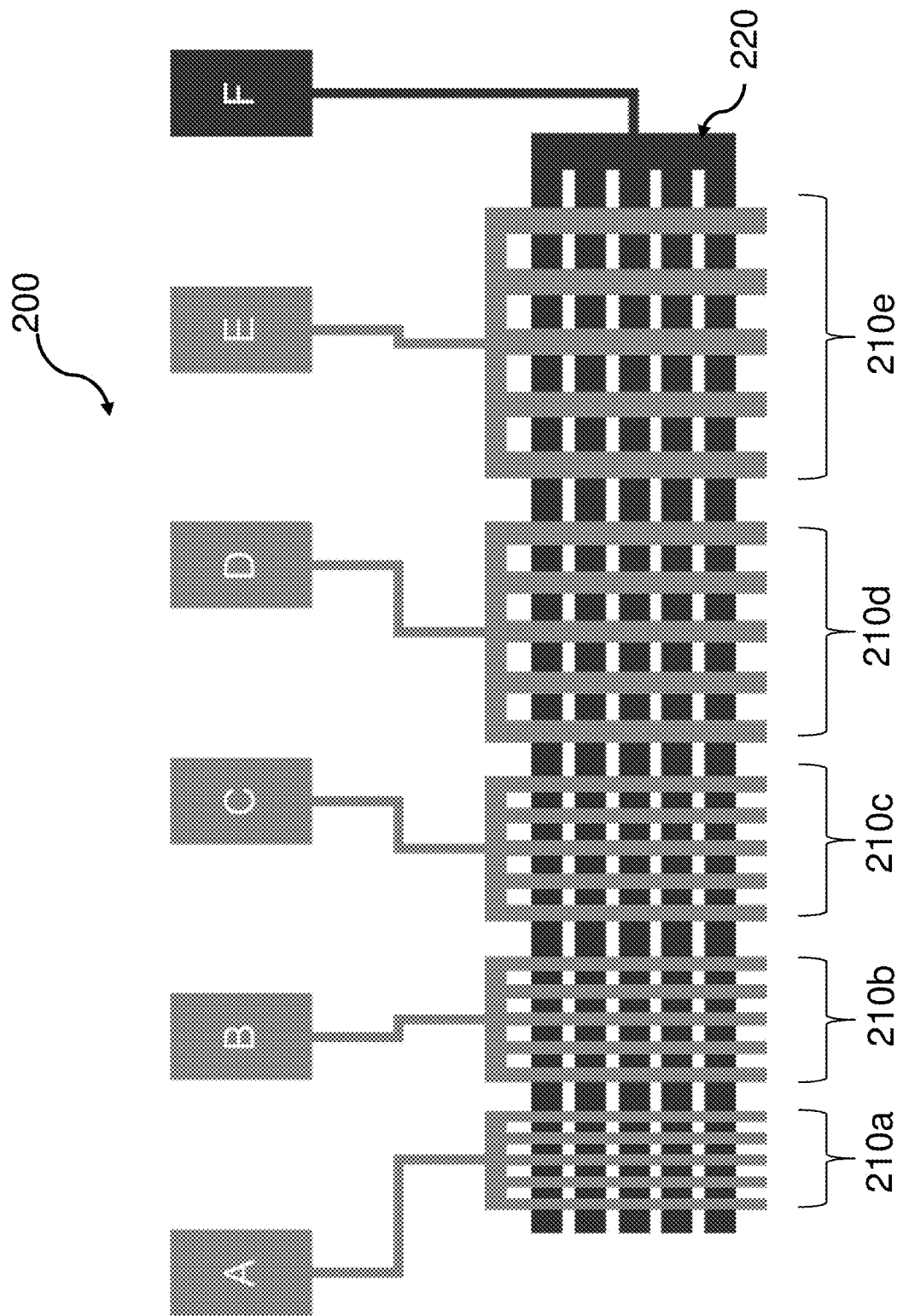
FIG. 2 shows a top down view of a structure of an embodiment of the disclosure having sub-arrays of metal wires over an electrical ground element in the form of a comb.

FIG. 2 depicts a top down view of a structure 200 of an embodiment of the disclosure having five sub-arrays of metal wires 210a, 210b, 210c, 210d, 210e over an electrical ground element 220. Different from FIG. 1, electrical ground element 220 is shown in the form of a comb (rather than a plate). Similar to FIG. 1, electrical ground element 220 is shown as being common to all five sub-arrays, sub-arrays 210a, 210b, 210c, 210d, 210e being connected to bond pads A, B, C, D, E respectively, and electrical ground element 220 being connected to bond pad F. As explained above with respect to the sub-arrays of metal wires, the comb form can vary from that shown, in this instance, the comb form of the electrical ground element. For example, the number of fingers of the electrical ground element comb can vary, the lengths of the fingers can vary, and the angle of the fingers to the backbone can vary as well.

Figure 3:
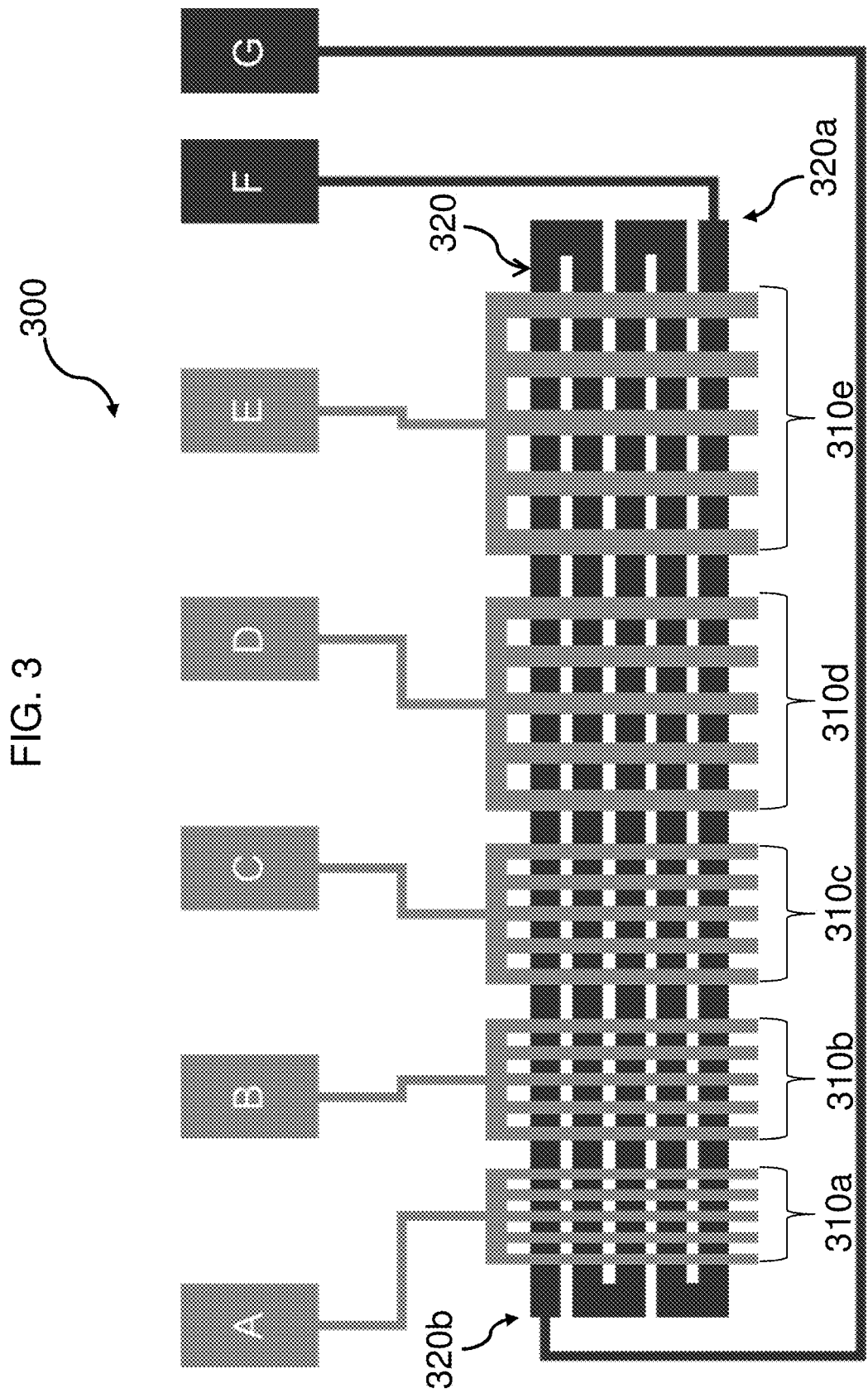
FIG. 3 shows a top down view of a structure of an embodiment of the disclosure having sub-arrays of metal wires over an electrical ground element in the form of a serpentine element.

FIG. 3 depicts a top down view of a structure 300 of an embodiment of the disclosure having five sub-arrays of metal wires 310a, 310b, 310c, 310d, 310e over an electrical ground element 320. Different from FIG. 1 and FIG. 2, electrical ground element 320 is shown in serpentine form (rather than a plate or comb). A serpentine form differs from a traditional comb form in that the individual fingers of the traditional comb are connected at adjacent ends to form one continuous winding pattern from a first end 320a to a second end 320b. The serpentine form differs further from a traditional comb form in that there is no "backbone" as mentioned above. The serpentine/winding pattern of electrical ground element 320 as shown in FIG. 3 depicts 180° turns within the pattern; however, turns of greater or lesser degree are possible, as long as the winding or snake-like (serpentine) nature of the pattern in maintained. The serpentine pattern of electrical ground element 320 as shown in FIG. 3 also depicts first end 320a and second end 320b being on opposite sides of the serpentine pattern. Ends 320a, 320b can be on the same side of the serpentine pattern, if desired. The number of turns can also vary. Also different from FIG. 1 and FIG. 2, the serpentine form of electrical ground element 320 in FIG. 3 results in element 320 being connected to two bond pads, namely F and G. Similar to FIG. 1 and FIG. 2, sub-arrays 310a, 310b, 310c, 310d, 310e are connected to bond pads A/B/C/D/E respectively, and electrical ground element 320 is spaced from all five sub-arrays.

Figure 4:
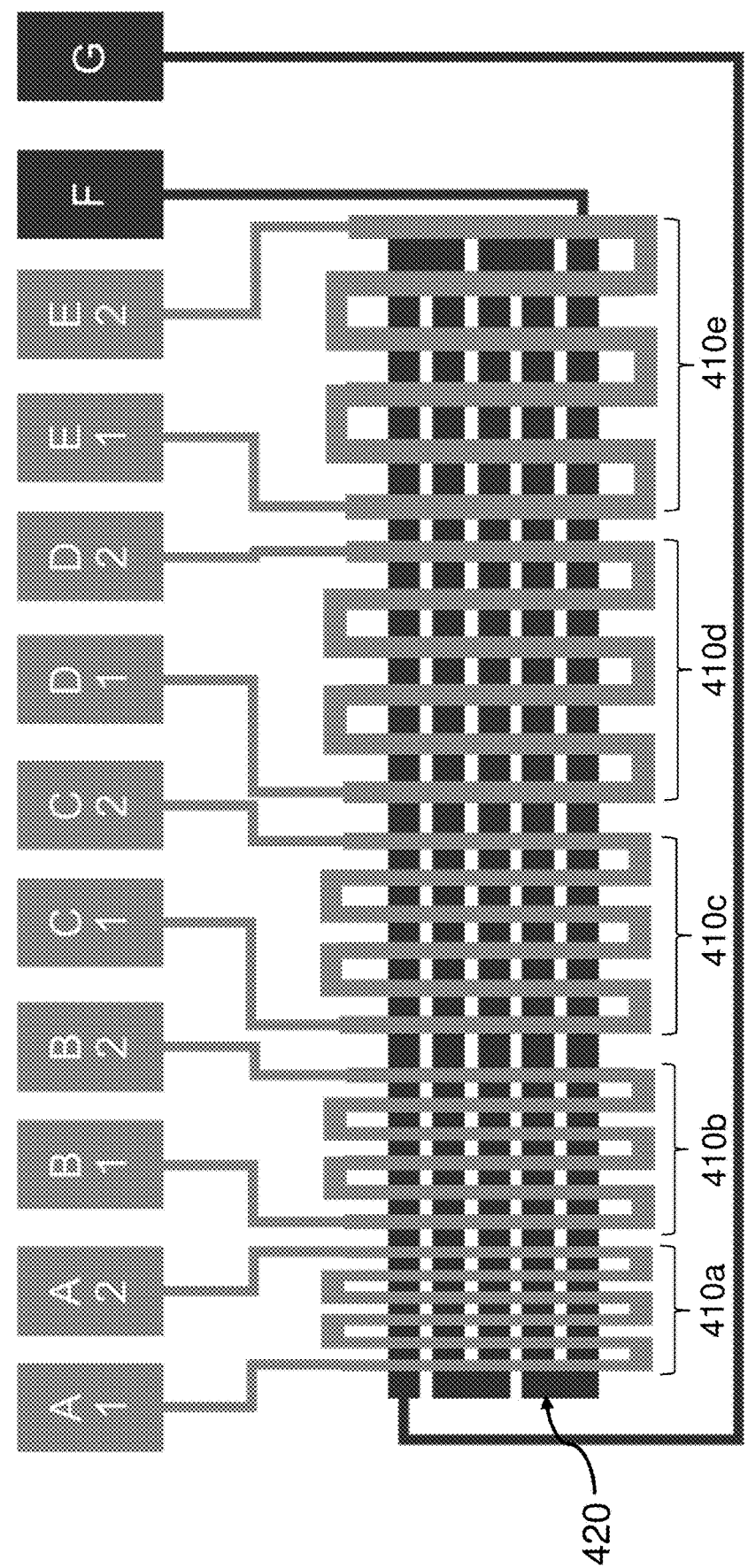
FIG. 4 shows a top down view of a structure of an embodiment of the disclosure having sub-arrays of metal wires over an electrical ground element in the form of a serpentine element, the sub-arrays of metal wires also being in serpentine form.

FIG. 4 depicts a top down view of a structure 400 of an embodiment of the disclosure having five sub-arrays of metal wires 410a, 410b, 410c, 410d, 410e over an electrical ground element 420 having a serpentine form, wherein element 420 is spaced from all five sub-arrays. Different from FIG. 1 through FIG. 3, the metal wires of sub-arrays 410a, 410b, 410c, 410d, 410e are in serpentine form, rather than a comb form. Thus, each sub-array 410a, 410b, 410c, 410d, 410e is connected to two bond pads, namely A1/A2, B1/B2, C1/C2, D1/D2 and E1/E2 respectively. Similar to FIG. 3, electrical ground element 420 in serpentine is connected to two bond pads, F and G. As described above, the serpentine form can vary from that which is shown in FIG. 4, namely the turns within the pattern can have varying angles and numbers, and the "ends" of the pattern can be on the same or different sides of the pattern.

Figure 5:
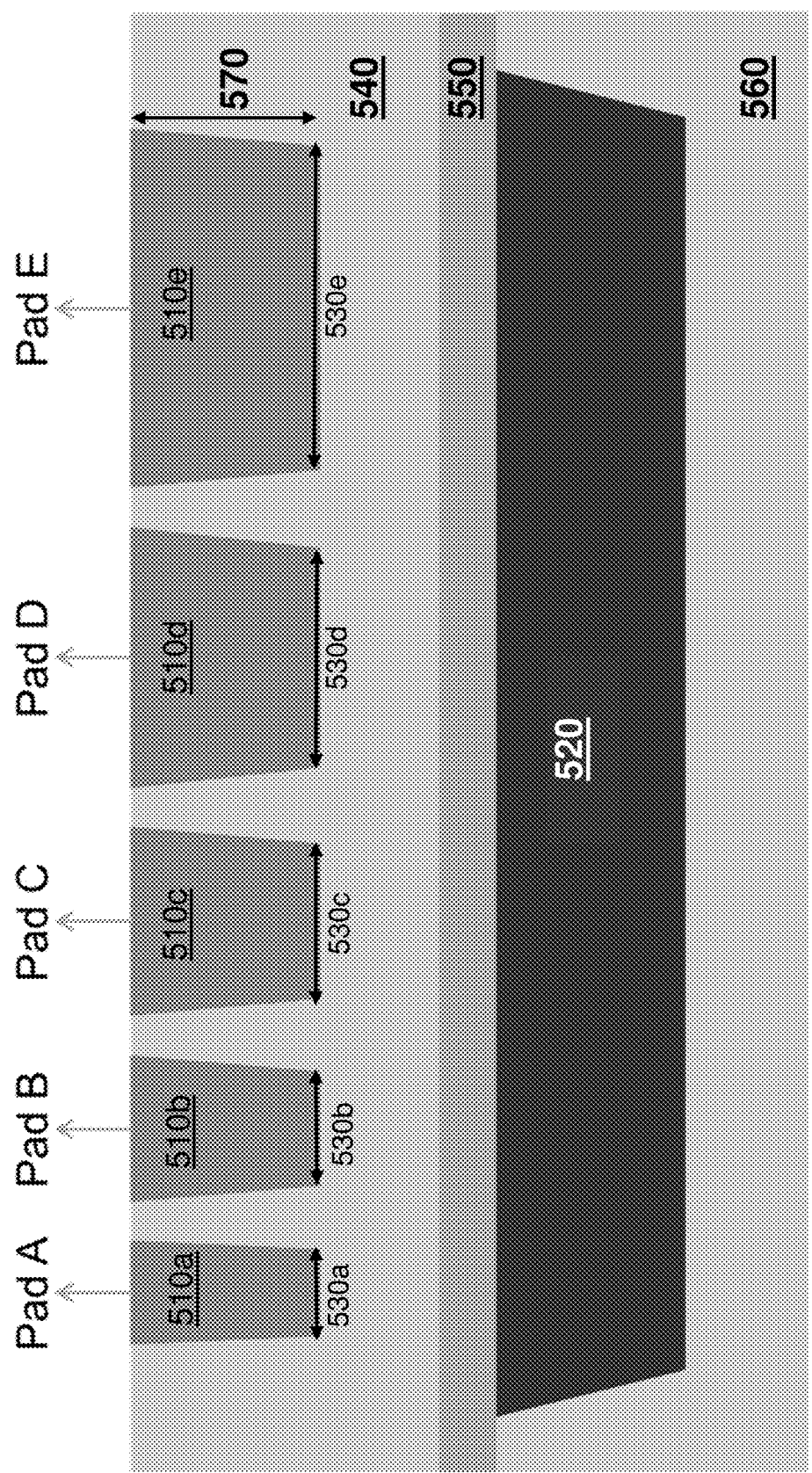
FIG. 5 shows a cross-section view of an ideal semiconductor structure without any RIE lag.
Figure 6:
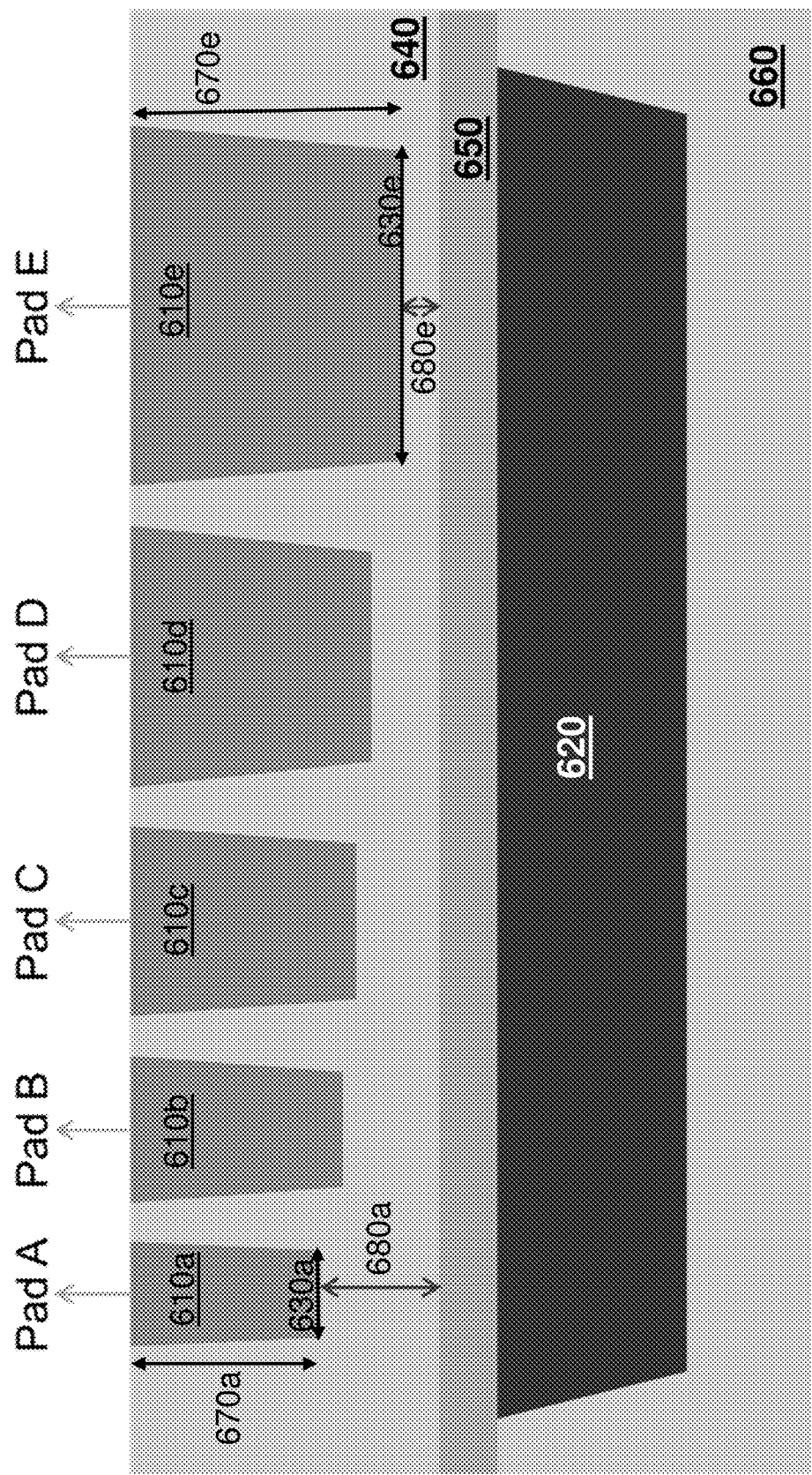
FIG. 6 shows a cross-section view of a semiconductor structure with RIE lag but without a RIE lag depth large enough to short the widest wires.
Figure 7:
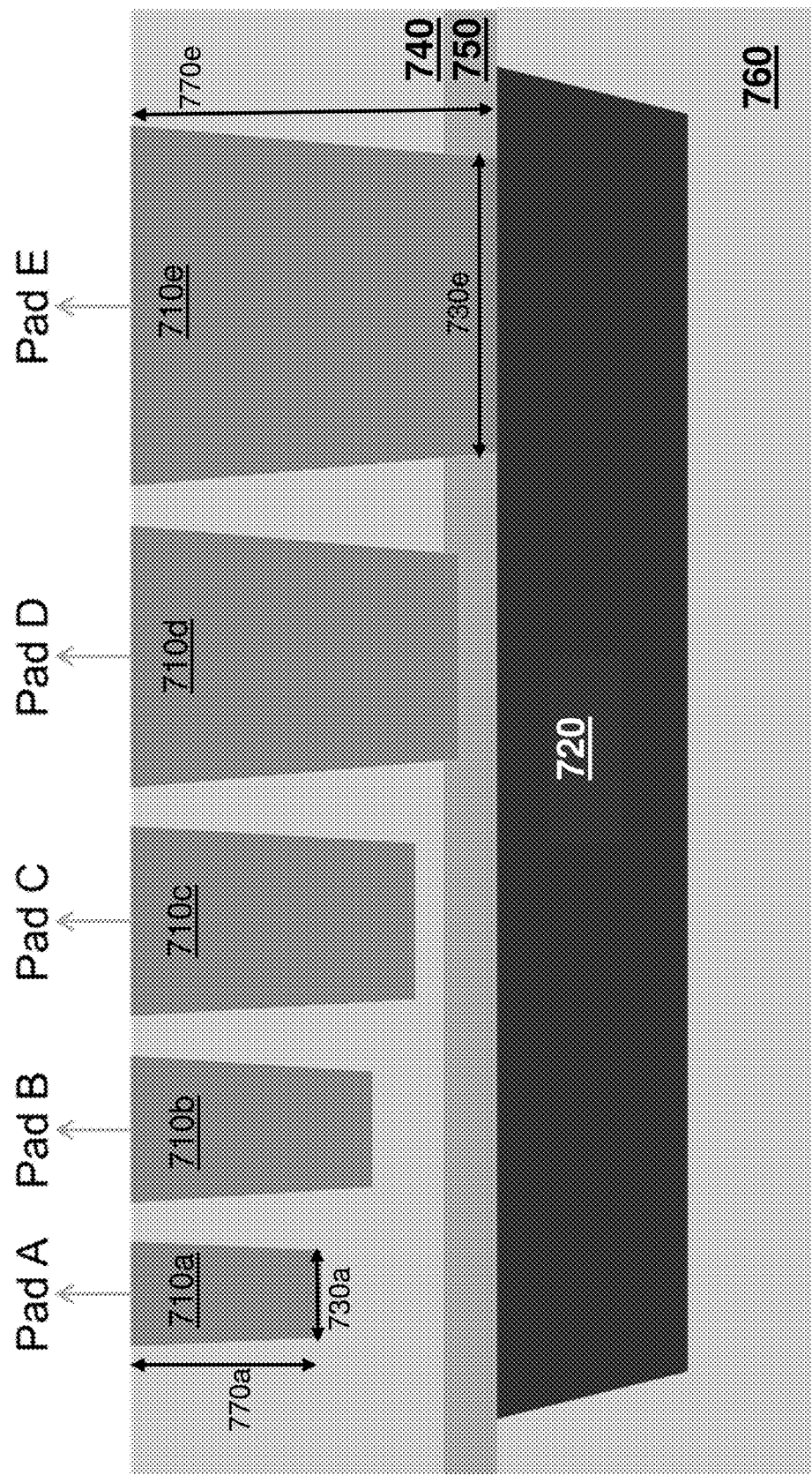
FIG. 7 shows a cross-section view of a semiconductor structure with RIE lag and with a RIE lag depth large enough to short the widest wires.

FIG. 1 through FIG. 4 depict top down views of example wire-array/ground/pad configurations of structures of the disclosure. To better understand the remaining components of the structures of the disclosure, as well as the later-discussed method of the disclosure, FIG. 5 through FIG. 7 depict cross-section views of structures like that depicted in FIG. 1. In FIGS. 5-7, cross-sections of sub-arrays are shown as one piece rather than individual fingers for clarity.

FIG. 5 depicts a cross-section view of an ideal semiconductor structure 500 without any RIE lag. Structure 500 includes a first metal layer 560, a dielectric cap layer 550 on top of first metal layer 560, an electrical ground element 520 formed beneath a portion of dielectric cap layer 550 and within first metal layer 560, and a second metal layer 540 on top of dielectric cap layer 550. Second metal layer 540 has five sub-arrays of metal wires 510a, 510b, 510c, 510d, 510e therein, each sub-array being connected to bond pads A/B/C/D/E. First metal layer 560 and second metal layer 540 comprise, independently of one another, at least one of a low dielectric constant (low-k) material and an ultra-low dielectric constant (ultra-low k) material. Such low-k and ultra-low k materials include, for example, dense carbon-doped silicon oxides, porous carbon-doped silicon oxides, and carbon-doped silicon nitrides. Low-k materials are traditionally those with k values less than 4, and ultra-low k materials are traditionally those with k values of less than 3. A typical k value range for ultra-low k materials is from about 2.2 to about 2.8. Dielectric cap layer 550 comprises at least one of silicon nitride, silicon carbide, boron nitride, silicon boron nitride, silicon boron nitride carbon, silicon carbon nitride, carbon boron nitride, aluminum oxide, aluminum nitride, or carbon doped silicon nitride.

As mentioned above, structure 500 of FIG. 5 is referred to as ideal because no RIE lag is present. In other words, despite varying wire widths 530a, 530b, 530c, 530d, 530e, depth 570 is constant. While no RIE lag as shown in FIG. 5 is ideal, as semiconductor device technology advances and moves to smaller and smaller sizes, RIE lag becomes more challenging and thus needs to be measured and monitored for potential deviations from ideal and electrical shorts.

FIG. 6 depicts a cross-section view of a semiconductor structure 600 with RIE lag but without a RIE lag depth large enough to short the widest wires. More specifically, structure 600 includes a first metal layer 660, a dielectric cap layer 650 on top of first metal layer 660, an electrical ground element 620 formed beneath a portion of dielectric cap layer 650 and within first metal layer 660, and a second metal layer 640 on top of dielectric cap layer 650. Second metal layer 640 has five sub-arrays of metal wires 610a, 610b, 610c, 610d, 610e therein, each sub-array being connected to bond pads A/B/C/D/E respectively. Structure 600 shows RIE lag by the fact that smallest wire width 630a has a smaller depth 670a than largest wire width 630e which has a larger depth 670e. However, since spaces 680a and 680e are present between the top of dielectric cap layer 650 and the bottom of the wire arrays 610a, 610e, there is no ability for current to pass between wire arrays 610a, 610e and electrical ground element 620, and thus no short. That is, spaces 680a, 680e indicate that the RIE lag is not too large.

In contrast, FIG. 7 depicts a cross-section view of a semiconductor structure 700 with RIE lag and with a RIE lag depth large enough to short the widest wires. More specifically, structure 700 includes a first metal layer 760, a dielectric cap layer 750 on top of first metal layer 760, an electrical ground element 720 formed between a portion of dielectric cap layer 750 and first metal layer 760, and a second metal layer 740. Second metal layer 740 has five sub-arrays of metal wires 710a, 710b, 710c, 710d, 710e therein, each sub-array being connected to bond pads A/B/C/D/E respectively. Similar to FIG. 6, structure 700 of FIG. 7 shows RIE lag by the fact that smallest wire width 730a has a smaller depth 770a than largest wire width 730e which has a larger depth 770e. However, in contrast to FIG. 6, no space exists between the top of dielectric cap layer 750 and the bottom of wire arrays 710d, 710e. This lack of space between the top of dielectric cap layer 750 and wire arrays 710d, 710e indicates that the RIE lag is too large and an electrical short is present.

An embodiment of the disclosure also provides a method of measuring RIE lag depth and identifying the existence of an electrical short of a semiconductor device. The method includes measuring a capacitance (C) between an electrical ground element and an array of metal wires. The method also includes measuring a width (W) and a pitch (P), if not already known, of the metal wires in the array of metal wires, and measuring a thickness ($d_{CAP}$) of a dielectric cap layer formed over the electrical ground element. Width (W) may be, for instance, 24 nanometers (nm) or less (e.g., 24 nm, 22 nm, 20 nm, 18 nm, 16 nm, 14 nm, etc.). Pitch (P) may be, for instance, 40 nanometers (nm) or less (e.g., 40 nm, 36 nm, 30 nm, 24 nm, etc.). Thickness ($d_{CAP}$) may be, for instance, from about 2 to about 12 nanometers (nm) (e.g., 2 nm, 4 nm, 6 nm, 8 nm, 10 nm, 12 nm). The measuring of the width (W) can be performed by any known technique including, for example, top down scanning electron microscopy (SEM), critical dimension scanning electron microscopy (CDSEM), and optical CD spectroscopy (OCD). The measuring of the thickness of the dielectric cap layer ($d_{CAP}$) can be performed by any known technique including, for example, ellipsometry. Typically, the pitch (P) is known (per design) and does not need to be measured.

After obtaining measurements C, W, P and $d_{CAP}$, the method of the disclosure calculates an area (A) of the metal wires in the array of metal wires, and calculates a distance ($d_{2ML}$) from a bottom surface of the array of metal wires to a top surface of the dielectric cap layer. Area (A) is calculated according to: $A=(L_1L_2W)/P$, where the array has a dimension $L_1 \times L_2$. $L_1$ and $L_2$, independently of one another, may be for instance, 50 micrometers (μm) or less (e.g., 50 μm, 45 μm, 40 μm, 35 μm, etc.). Distance ($d_{2ML}$) is calculated according to: $d_{2ML}=[(k_{2ML})(k_{CAP})(\varepsilon_0)(A)-(C)(d_{CAP})(k_{2ML})]/C(k_{CAP})$, where $k_{2ML}$ is a dielectric constant of a second metal layer (2ML), $k_{CAP}$ is a dielectric constant of the dielectric cap layer (CAP), and $\varepsilon_0$ is $8.854 \times 10^{-12}$ Farads/meter (F/m), the second metal layer (2ML) being formed over the dielectric cap layer (CAP). An example of distance $d_{2ML}$ is distance 680a and distance 680e as shown in FIG. 6. The dielectric constant of the second metal layer ($k_{2ML}$) is in a range of from about 1.8 to about 4, and the dielectric constant of the dielectric cap layer ($k_{CAP}$) is in a range of from about 3.5 to about 8.

Distance $d_{2ML}$ described above is the RIE lag depth for a given array of metal wires having width W. After calculating $d_{2ML}$, the method of the disclosure identifies the existence of an electrical short for metal wires with width (W) and RIE lag depth ($d_{2ML}$). More specifically, a pass status for lack of an electrical short is assigned to any array of metal wires which is not able to pass a current to the electrical ground element (e.g., FIG. 5, FIG. 6), and a fail status for existence of an electrical short is assigned to any array of metal wires which is able to pass a current to the electrical ground element (e.g., FIG. 7). The assigning of a pass/fail status and the above-described calculating of the noted values may be performed by a system containing a controller (e.g., computer).

An embodiment of the disclosure also provides a system for measuring RIE lag depth and identifying the existence of an electrical short of a semiconductor device. The system of the disclosure includes a test structure for measuring RIE lag depth, and a controller for identifying whether an electrical short exists. The test structure of the system of the disclosure can be the structure defined herein as the first aspect of the disclosure, including all of its potential variations as described. The controller of the system of the disclosure can be, for instance, a computer that is in communication with the test structure and capable of receiving the above-described measurements, performing the above-described calculations, and assigning the above-described pass/fail status for an electrical short.

The method and system of the disclosure allow for identifying whether an electrical short exists for metal wires of certain widths (i.e., wires of a width (W)) and certain RIE lag depths (i.e., wires having a RIE lag depth ($d_{2ML}$)), and are able to do so using electrical-based measurements that do not require expensive techniques or destructive testing techniques, such as those requiring cutting of the semiconductor wafer. For instance, the measuring of the width (W) of the metal wires can be performed by top down scanning electron microscopy (SEM), critical dimension scanning electron microscopy (CDSEM) or optical CD spectroscopy (OCD), and the measuring of the thickness of the dielectric cap layer ($d_{CAP}$) can be performed by ellipsometry. Another benefit of the structures, methods and systems of the disclosure is their applicability to devices with fine pitch (P), including those with pitches as low as 40 nanometers or less, and to devices with small wire width (W), including those with wire widths of 24 nanometers or less. Furthermore, the size of the array that the structures, methods and systems of the disclosure use is quite small, for example 50 micrometers×50 micrometers, thus enabling placement on the kerf (periphery) of the semiconductor chip.

Regarding the ability of the methods and systems of the disclosure to identify an electrical short for metal wires of a given width and having a given RIE lag depth, wire arrays in which current is able to be passed to the electrical ground element indicates a short, and thus a fail status, while wire arrays in which current is not able to be passed to the electrical ground element indicates lack of a short, and thus a pass status. Such a pass/fail assignment to different width wires having different RIE lag depths in a semiconductor device, in combination with the less expensive and non-destructive techniques of the methods and systems of the disclosure provide a valuable solution to the problem in the field of only destructive and/or expensive RIE lag depth testing being available.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

I claim:

1. A structure for measuring reactive ion etching (RIE) lag depth of a semiconductor device, comprising:
    a first metal layer;
    a dielectric cap layer on top of the first metal layer;
    an electrical ground element formed beneath one or more portions of the dielectric cap layer and within the first metal layer, the electrical ground element being electrically grounded; and
    a second metal layer on top of the dielectric cap layer, the second metal layer having an array of one or more sub-arrays of metal wires, each sub-array being connected to a respective bond pad and having metal wires of a given width;
    wherein a distance from a bottom surface of the array of metal wires to a top surface of the dielectric cap layer is indicative of RIE lag depth.

2. The structure of claim 1, wherein the array comprises two or more sub-arrays, a first sub-array having metal wires of a first width and at least one subsequent sub-array having metal wires of a second, different width from the first width.

3. The structure of claim 1, wherein the first width or the second width of the metal wires is 24 nanometers or less.

4. The structure of claim 1, wherein the first and second metal layers comprise at least one of a low dielectric constant (low-k) material and an ultra-low dielectric constant (ultra-low k) material.

5. The structure of claim 1, wherein the dielectric cap layer comprises at least one of silicon nitride, silicon carbide, boron nitride, silicon boron nitride, silicon boron nitride carbon, silicon carbon nitride, carbon boron nitride, aluminum oxide, aluminum nitride, or carbon doped silicon nitride.

6. The structure of claim 1, wherein the metal wires and the electrical ground element each comprise copper, ruthenium, cobalt, tungsten, titanium, aluminum or molybdenum.

7. The structure of claim 1, wherein the electrical ground element is in the form of a plate, a comb or a serpentine element.

8. The structure of claim 1, wherein one electrical ground element is in electrical contact with all sub-arrays.

9. The structure of claim 1, wherein one electrical ground element is in electrical contact with a given sub-array.

\* \* \* \* \*